(12) United States Patent
Hyoung et al.

(10) Patent No.: US 11,668,741 B2
(45) Date of Patent: Jun. 6, 2023

(54) METHOD FOR MEASUREMENT OF ELECTROMAGNETIC FIELD, AND SYSTEM THEREFOR

(71) Applicant: ELECTRONICS AND TELECOMMUNICATIONS RESEARCH INSTITUTE, Daejeon (KR)

(72) Inventors: Chang Hee Hyoung, Daejeon (KR); Jong Hwa Kwon, Daejeon (KR); Jung Hwan Hwang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 17/547,815

(22) Filed: Dec. 10, 2021

(65) Prior Publication Data

US 2022/0236311 A1      Jul. 28, 2022

(30) Foreign Application Priority Data

Jan. 27, 2021   (KR) .......................... 10-2021-0011264

(51) Int. Cl.
*G01R 27/28*   (2006.01)
*G01R 29/10*   (2006.01)

(52) U.S. Cl.
CPC .................................. *G01R 29/105* (2013.01)

(58) Field of Classification Search
CPC ............. G01R 29/0835; G01R 29/105; G01R 29/0814; G01R 29/0821; G01R 29/0871; G01R 29/26; G01R 29/10; G01R 29/08; G01R 1/04; G01R 1/06; G01R 1/18; G01R 1/07342; G01R 1/06711; G01R 1/06772; G01R 31/2886; G01R 31/2889; G01R 31/002; G01R 31/28
See application file for complete search history.

(56) References Cited

U.S. PATENT DOCUMENTS 5,414,345 A * 5/1995 Rogers ............... G01R 29/0814
                                                                324/637
9,220,081 B2   12/2015 Prechner et al.
9,374,674 B2   6/2016  Lee
(Continued)

FOREIGN PATENT DOCUMENTS

JP   2001-013182 A    1/2001
JP   2007-183211 A    7/2007
KR   10-1317338 B1    10/2013

*Primary Examiner* — Thang X Le
(74) *Attorney, Agent, or Firm* — LRK Patent Law Firm (57) ABSTRACT

An electromagnetic wave measurement system may include: a reference receiving device; a plurality of auxiliary receiving devices; and a control device connected to the reference receiving device and the plurality of auxiliary receiving devices, wherein the reference receiving device has a wider dynamic range than the plurality of auxiliary receiving devices, the control device collects a frequency-specific measurement value from each of the reference receiving device and the plurality of auxiliary receiving devices, and the frequency-specific measurement value of each of the auxiliary receiving devices is calibrated based on the frequency-specific measurement value of the reference receiving device.

20 Claims, 7 Drawing Sheets

(56) References Cited

U.S. PATENT DOCUMENTS

| | | |
|---|---|---|
| 2012/0109536 A1 | 5/2012 | Pasveer et al. |
| 2013/0172010 A1 | 7/2013 | Kang et al. |
| 2014/0136134 A1 | 5/2014 | Oh et al. |
| 2015/0149108 A1* | 5/2015 | Cozza .................... G01N 27/00 702/124 |
| 2016/0252554 A1* | 9/2016 | Opitz ....................... G01R 1/04 324/612 |
| 2018/0049279 A1* | 2/2018 | Guatta ................... H05B 6/686 |
| 2019/0036621 A1* | 1/2019 | Vanwiggeren ....... H04B 17/354 |
| 2021/0018547 A1* | 1/2021 | Brigance ............ G01R 29/0821 |
| 2022/0107350 A1* | 4/2022 | Gerstner .............. G01R 31/002 |

* cited by examiner

METHOD FOR MEASUREMENT OF ELECTROMAGNETIC FIELD, AND SYSTEM THEREFOR

CROSS-REFERENCE TO RELATED APPLICATION

This application claims priority to Korean Patent Application No. 10-2021-0011264, filed on Jan. 27, 2021, with the Korean Intellectual Property Office (KIPO), the entire contents of which are hereby incorporated by reference.

BACKGROUND

1. Technical Field

The present disclosure relates to a method and a system for measuring a power or magnitude of electromagnetic waves distributed within a target space, and more particularly, to a method and a system for measuring electromagnetic waves distributed within a measurement target space by using a reference receiving device and a plurality of auxiliary receiving devices together.

2. Description of Related Art

The shielding facilities or shielding racks are being used to protect major facilities from intentional electromagnetic wave attacks. Such the shielding facilities or devices are generally located within a building where facilities or equipments are operated, and for safety reasons, the facilities or equipments are located inside or underground of the building rather than a space within the building facing an exterior wall. Currently, there are no accurate evaluation standards of the shielding effects for the building in which the shielding facilities or devices are installed. Therefore, the shielding effects required to protect the equipments from electromagnetic wave attacks from outside the building are required to be entirely covered by the shielding facilities and shielding racks. This is due to the standards made based on military facilities where shielding facilities or shielding racks are directly exposed to electromagnetic wave attacks, and they do not reflect the reality in which major protection targets corresponding to social infrastructures are being operated.

SUMMARY

Accordingly, exemplary embodiments of the present disclosure are directed to providing an electromagnetic wave measurement system for measuring electromagnetic wave distribution at a plurality of points within a measurement target space by using one reference receiving device having high precision and a plurality of auxiliary receiving devices.

Accordingly, exemplary embodiments of the present disclosure are also directed to providing an operation method of the above-described electromagnetic wave measurement system.

Accordingly, exemplary embodiments of the present disclosure are also directed to providing a control device for the above-described electromagnetic wave measurement system.

According to a first exemplary embodiment of the present disclosure, an electromagnetic wave measurement system for measuring a distribution of electromagnetic waves within a measurement target space may comprise: a reference receiving device; a plurality of auxiliary receiving devices; and a control device connected to the reference receiving device and the plurality of auxiliary receiving devices, wherein the reference receiving device has a wider dynamic range than the plurality of auxiliary receiving devices, the control device collects a frequency-specific measurement value from each of the reference receiving device and the plurality of auxiliary receiving devices, and the frequency-specific measurement value of each of the auxiliary receiving devices is calibrated based on the frequency-specific measurement value of the reference receiving device.

Each of the reference receiving device and the auxiliary receiving devices may be configured with a field probe and an electric field strength meter for measuring a magnitude of an electric field.

Each of the reference receiving device and the auxiliary receiving devices may be configured with an antenna and a spectrum analyzer for measuring a reception power.

The control device may generate, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

When each of the reference receiving device and the auxiliary receiving devices is configured with an isotropic antenna or a field probe, the frequency-specific calibration information may be generated in a state in which the reference receiving device and the auxiliary receiving devices are located in a reverberation room, and when each of the reference receiving device and the auxiliary receiving devices is configured with a directional antenna, the frequency-specific calibration information may be generated in a state in which the reference receiving device and the auxiliary receiving devices are located in a (semi)anechoic room.

When the frequency-specific calibration information is generated in a state in which the reference receiving device and the auxiliary receiving devices are located in the (semi)anechoic room, the frequency-specific calibration information may be generated by rotating the field probe or antenna of each of the reference receiving device and the auxiliary receiving devices.

The control device may output electromagnetic wave attenuation characteristics of the measurement target space as a ratio between a reception power of an unintentional transmission signal which is measured outside the measurement target space and a reception power of the unintentional transmission signal which is measured inside the measurement target space, the unintentional transmission signal being transmitted from a transmitter for broadcasting or communication located around the measurement target space.

The measurement system may further include a transmitter that incidents an intentional transmission signal into the measurement target space from outside the measurement target space, and the control device may output electromagnetic wave attenuation characteristics of the measurement target space as a ratio between a reception power of the intentional transmission signal which is measured outside the measurement target space and a reception power of the intentional transmission signal which is measured inside the measurement target space.

The control device may adjust the transmission power of the transmitter such that reception powers of the transmission signal at the auxiliary receiving devices fall within a dynamic range of the auxiliary receiving devices.

According to a second exemplary embodiment of the present disclosure, an electromagnetic wave measurement method for measuring a distribution of electromagnetic waves within a measurement target space, performed by a control device in a measurement system including a reference receiving device, a plurality of auxiliary receiving devices, and the control device, may comprise: collecting a frequency-specific measurement value from the reference receiving device; collecting a frequency-specific measurement value from each of the plurality of auxiliary receiving devices; and calibrating the frequency-specific measurement value of each of the auxiliary receiving devices based on the frequency-specific measurement value of the reference receiving device, wherein the reference receiving device has a wider dynamic range than the plurality of auxiliary receiving devices.

The electromagnetic wave measurement method may further comprise generating, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

When each of the reference receiving device and the auxiliary receiving devices is configured with an isotropic antenna or a field probe, the frequency-specific calibration information may be generated in a state in which the reference receiving device and the auxiliary receiving devices are located in a reverberation room, and when each of the reference receiving device and the auxiliary receiving devices is configured with a directional antenna, the frequency-specific calibration information may be generated in a state in which the reference receiving device and the auxiliary receiving devices are located in a (semi)anechoic room.

When the frequency-specific calibration information is generated in a state in which the reference receiving device and the auxiliary receiving devices are located in the (semi)anechoic room, the frequency-specific calibration information may be generated by rotating the field probe or antenna of each of the reference receiving device and the auxiliary receiving devices.

The electromagnetic wave measurement method may further comprise outputting electromagnetic wave attenuation characteristics of the measurement target space as a ratio between a reception power of an unintentional transmission signal which is measured outside the measurement target space and a reception power of the unintentional transmission signal which is measured inside the measurement target space, the unintentional transmission signal being transmitted from a transmitter for broadcasting or communication located around the measurement target space.

The electromagnetic wave measurement method may further comprise, when the measurement system further includes a transmitter that incidents an intentional transmission signal into the measurement target space from outside the measurement target space, outputting electromagnetic wave attenuation characteristics of the measurement target space as a ratio between a reception power of the intentional transmission signal which is measured outside the measurement target space and a reception power of the intentional transmission signal which is measured inside the measurement target space.

The electromagnetic wave measurement method may further comprise adjusting the transmission power of the transmitter such that reception powers of the transmission signal at the auxiliary receiving devices fall within a dynamic range of the auxiliary receiving devices.

According to a third exemplary embodiment of the present disclosure, a control device of a measurement system including a reference receiving device, a plurality of auxiliary receiving devices, and the control device may comprise: a processor; a memory electronically communicating with the processor; and instructions stored in the memory, wherein when executed by the processor, the instructions cause the control device to: collect a frequency-specific measurement value from the reference receiving device; collect a frequency-specific measurement value from each of the plurality of auxiliary receiving devices; and calibrate the frequency-specific measurement value of each of the auxiliary receiving devices based on the frequency-specific measurement value of the reference receiving device, wherein the reference receiving device has a wider dynamic range than the plurality of auxiliary receiving devices.

The instructions may further cause the control device to: generate, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

When each of the reference receiving device and the auxiliary receiving devices is configured with an isotropic antenna or a field probe, the frequency-specific calibration information may be generated in a state in which the reference receiving device and the auxiliary receiving devices are located in a reverberation room, and when each of the reference receiving device and the auxiliary receiving devices is configured with a directional antenna, the frequency-specific calibration information may be generated in a state in which the reference receiving device and the auxiliary receiving devices are located in a (semi)anechoic room.

When the frequency-specific calibration information is generated in a state in which the reference receiving device and the auxiliary receiving devices are located in the (semi) anechoic room, the frequency-specific calibration information may be generated by rotating the field probe or antenna of each of the reference receiving device and the auxiliary receiving devices.

As described above, the electromagnetic wave measurement system and method according to exemplary embodiments of the present disclosure can reduce a measurement time required for measuring reception powers or magnitudes at a plurality of points by using one high-precision reference receiving device and a plurality of auxiliary receiving devices, instead of using a single measurement device for a wide frequency band while moving from place to place. In addition, measurement values of the plurality of auxiliary receiving devices having low precision are calibrated based on a measurement value of the reference receiving device having high precision, so that a result with high accuracy can be obtained even using relatively inexpensive auxiliary receiving devices.

DETAILED DESCRIPTION OF THE EMBODIMENTS

Exemplary embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

Materials may be selected according to various requirements in consideration of physical reliability and energy efficiency, and a building may be constructed using the selected materials. General materials have electromagnetic wave attenuation characteristics of a certain amount or more, but may have a lower shielding effect than a high-level shielding effect required for shielding facilities and shielding racks. A general large-scale building may be classified into a building using concrete and glass and a building using steel and glass. Glass has a design aspect as well as an excellent functional aspect that utilizes natural light. Recently, in consideration of the energy efficiency required for buildings, the use of a multi-layer glass with a metal thin film is gradually increasing because it blocks unnecessary heat from the outside or prevents internal heat loss. In the electromagnetic aspect, glass has almost no loss (i.e., there is no electromagnetic wave shielding effect), but the metal thin film inserted to improve thermal efficiency and a dry air layer inserted to prevent condensation of the multiple-layer structure have different electromagnetic wave characteristics from those of the known glass so far. In a study analyzing the loss characteristics of glass used in buildings from the viewpoint of electromagnetic wave attenuation, it is known that a low-emissivity (i.e., Low-E) glass with a metal thin film has an electromagnetic wave shielding effect of 30 dB or more. Although such the shielding effect may be unwanted characteristics from the viewpoint of communication in which signals are exchanged using electromagnetic waves, it is a very good material from the viewpoint of protecting major facilities from electromagnetic wave attacks. Prior to the electromagnetic wave loss of glass, there have been many studies on the electromagnetic wave loss of concrete materials constituting buildings. In order for a concrete wall to obtain the same shielding effect as the low-E glass, steel frames with a certain interval or more should be inserted inside. In general, steel frames are densely inserted into columns and exterior walls that are subjected to building loads, but other points are composed of only concrete without steel frames.

In consideration of energy efficiency and construction cost, low-E glass is used for heat blocking and loss prevention at points where it meets the outside, but tempered glass is used inside. The tempered glass has physical reliability, but from the viewpoint of electromagnetic waves, it is treated as lossless (i.e., little shielding effect). The entrance of a modern general building should be equipped with a windproof room and a windproof space under certain conditions according to the building act to prevent heat entry and exit due to indoor/outdoor air exchange. In this case, tempered glass, not low-E glass, is used as the glass used in the windproof room and the windproof space in consideration of the safety issue of the entrants. The windproof room and windproof space used for entry and exit are paths that have the least loss (i.e., shielding effect) from the outside to the inside in terms of electromagnetic waves.

So far, in terms of electromagnetic wave attenuation, materials that make up general large-scale buildings have been described. Unlike shielding facilities, general large-scale buildings are designed and built in view of the physical and energy efficiency required by the building act without considering the purpose of electromagnetic protection, even if they are major facilities. As a method to evaluate the shielding effectiveness of general large-scale buildings made of materials with various shielding effects and to define the shielding requirements for them, it is required to measure the electromagnetic wave attenuation distribution in a space to be measured in a general large-scale building.

Unlike shielding facilities made of a single material with high shielding effectiveness, general large-scale buildings are constructed from materials with no shielding effects such as tempered glass, materials with a shielding effect of 30 dB or more such as low-E glass, and materials having a high shielding effect which are used for shielding facilities such as metal. Even with a reinforced concrete structure, a loss for each frequency varies according to a spacing of the reinforcing bars. There are various electronic devices and other ancillary facilities suitable for the purpose of the protection facility in operation, and these devices ad facilities make it difficult to predict the electromagnetic wave environment of the space to be measured. Due to these complex situations, there is a limit to the analysis of electromagnetic wave attenuation or shielding effect through electromagnetic simulation.

The electromagnetic waves injected from the outside undergo attenuation through interfaces of the building, and the electromagnetic waves introduced into the indoor space undergo a complex scattering process such as reflection, absorption, refraction, and diffraction by various objects distributed in the space. Therefore, reinforcement and cancellation phenomena occur, and these phenomena have different characteristics for each frequency.

Considering these characteristics, in order to accurately measure the electromagnetic wave environment or distribution characteristics, it is required to configure virtual three-dimensional points in a measurement target space and measure a plurality of points. Not only the distribution of electromagnetic waves varies according to points in the two-dimensional space, but also the distribution of electromagnetic waves may vary depending on a height at one point. When evaluation is performed for a wide frequency band, it takes a lot of time and effort, and it is almost impossible to accurately measure the electromagnetic wave characteristics of a room by the electromagnetic wave incident from the outside.

The present disclosure relates to a method and a system for measuring a power or magnitude of electromagnetic waves distributed within a measurement target space. The present disclosure relates to a technical field that evaluates how electromagnetic waves incident from the outside are distributed within the measurement target space when they enter the indoor space of a general large-scale buildings other than facilities developed or manufactured for special purposes related to electromagnetic waves such as (semi) anechoic rooms and electromagnetic wave reverberation rooms.

As described above, a general large-scale building is made of materials having different shielding effects, and accordingly, electromagnetic waves within a space having an interface with an external electromagnetic wave signal source are expected to have a large deviation depending on a position. In case of a radio communication service band, a received signal strength indication (RSSI) measurement function included in a receiver may be used. A large number of relatively inexpensive terminals may be used to measure reception powers once or the reduced number of times at various points within a measurement target space. The measurement results may be analyzed to find the distribution of electromagnetic waves and points having weak shielding effects. In order to analyze the electromagnetic wave attenuation characteristics and weaknesses in a band in which radio communication services are not provided, expensive measurement equipment should be moved at regular intervals to measure. The equipment for measuring the magnitude of electromagnetic waves consists of an electric field probe and an electric field strength meter. When measuring the power of electromagnetic waves, an antenna and a spectrum analyzer are used. Physical quantities measured through the two measurement systems are compatible with each other if the characteristics of the devices used for the measurement are known.

The technical problem to be achieved by the present disclosure is to provide an apparatus and method for measuring the approximated power or magnitude of electromagnetic waves incident from the outside into a room. That is, the present disclosure proposes a method and a system for measuring the indoor electromagnetic wave environment by simultaneously using a device with excellent precision (i.e., reference receiving device) and a plurality of auxiliary receiving devices with relatively low precision.

Figure 1:
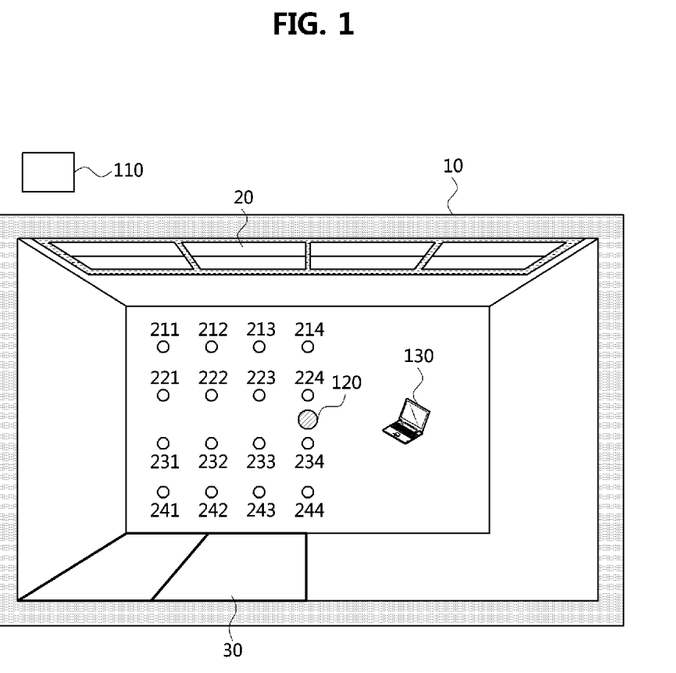
FIG. 1 is a conceptual diagram for describing deployment of an electromagnetic wave measurement system according to an exemplary embodiment of the present disclosure.

FIG. 1 is a conceptual diagram for describing deployment of an electromagnetic wave measurement system according to an exemplary embodiment of the present disclosure.

Referring to FIG. 1, a reference receiving device 120, which is a high-precision measurement device, may be disposed in a center of a measurement target space 10, and a plurality of auxiliary receiving devices 211 to 244 for measuring an electromagnetic distribution of the measurement target space may be disposed. In addition, the reference receiving device 120 and the auxiliary receiving devices 211 to 244 may be connected to a control device 130 and controlled by the control device 130.

The reference receiving device 120 with high precision located within the measurement target space (preferably in the center) may be composed of an electric field probe and an electric field strength meter for measuring the magnitude of the electric field, or an antenna and a spectrum analyzer for measuring a power thereof. The probe that measures an electric field strength may be generally isotropic and may have a lower gain compared to an antenna. On the other hand, as an antenna for the reference receiving device 120, a directional antenna may be used, and the spectrum analyzer may have a very wide dynamic range capable of measuring the power from a very low signal level of −140 dBm or less to 25 dBm. However, an isotropic antenna may also be used. In addition, each of the plurality of auxiliary receiving devices may also be configured to include a probe or (isotropic or directional) antenna.

Meanwhile, in case of a general-scale large building, as shown in FIG. 1, there are windows 20 on exterior walls and a door 30 connected to a hallway. In case of the window located on the exterior wall, a low-E glass having a metal thin film may be used to reduce a heat loss, and in case of the door or window leading to a hallway, tempered glass may be used.

As a method of measuring an electromagnetic wave loss of a general large-scale building, there are a scheme of using an unintentional transmission signal and a scheme of using an intentional transmission signal. The scheme of using an unintentional transmission signal is to use a broadcasting or communication frequency. A position of a broadcasting or communication transmitter located around the measurement target space is identified, and the electromagnetic wave attenuation characteristics of the measurement target space may be determined by a ratio between reception powers measured outside the measurement target space and measured within the measurement target space. However, the scheme of using an unintentional transmission signal has a limited frequency that can be evaluated, and there is a limitation in selecting a weak incident surface between the position of the transmitter and the measurement target space. In contrast, in the scheme of using an intentional transmission signal, the electromagnetic wave attenuation characteristics may be measured over a wide frequency band by locating a transmitter 110 outside of a measurement target building and injecting the electromagnetic wave toward the measurement target space 10. For example, a ratio between a transmission power of the intentional transmission signal to a reception power of the intentional transmission signal in the measurement target space may be measured as the electromagnetic wave attenuation characteristics of the measurement target space. When the intentional transmission signal is used, electromagnetic wave attenuation from the position where the transmitter 110 is located to the inside of the measurement target space may be measured using a higher power than an unintentional signal. Meanwhile, the transmitter 110 may be connected to and controlled by the control device 130 as a component of the measurement system.

In FIG. 1, in order to measure the electromagnetic wave attenuation of the measurement target space 10, the transmitter 110 for injecting the intentional transmission signal into the measurement target space is located outside the window 20 located in the upper portion of the measurement target space 10. A transmission antenna of the transmitter 110 located outside the building in order to inject a plane wave into the measuring target space 10 may be spaced apart from the building by a certain distance or more, and the transmitter 110 and the measurement target building should be separated so that the measurement target space 10 is located within a half power beam width (HPBW) of the transmission antenna. The electromagnetic waves passing through an interface having various shielding effects are attenuated by the different shielding effects of various materials and introduced into the measurement target space. The electromagnetic waves introduced into the measurement target space undergo complex scattering by the interfaces dividing the space and various furniture, office supplies, and business devices located inside.

Figure 2:
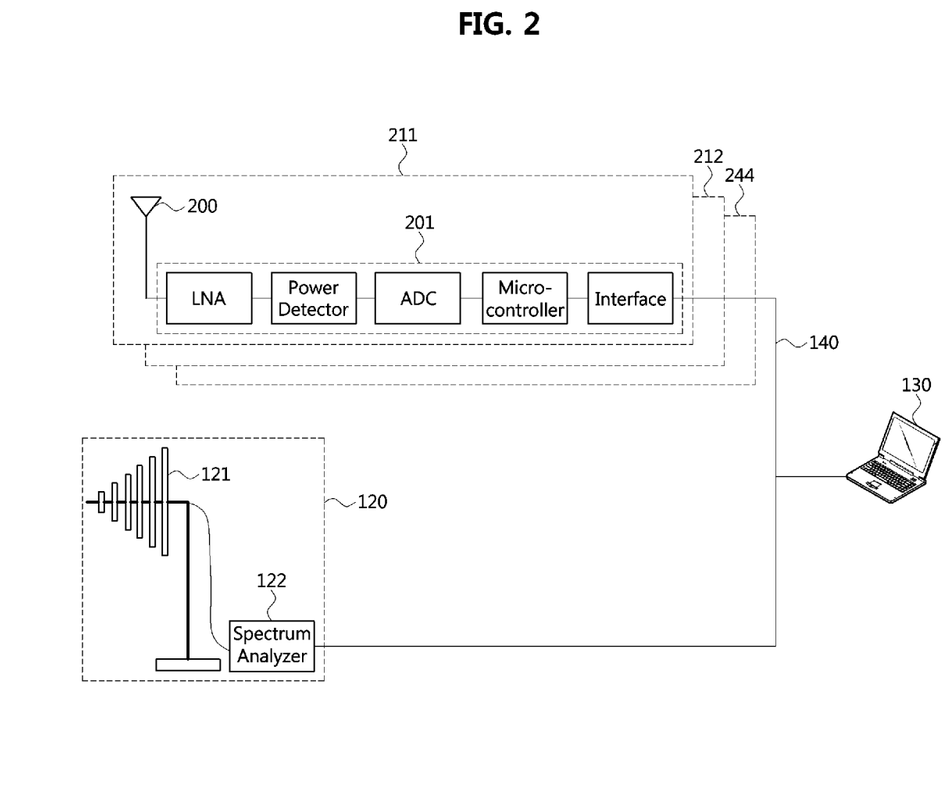
FIG. 2 is a conceptual diagram for describing a configuration of an electromagnetic wave measurement system according to an exemplary embodiment of the present disclosure.

FIG. 2 is a conceptual diagram for describing a configuration of an electromagnetic wave measurement system according to an exemplary embodiment of the present disclosure.

FIG. 2 shows a configuration of the measurement system using the reference receiving device 120 including a directional antenna and a spectrum analyzer for evaluating a reception power and the plurality of auxiliary receiving devices 211 to 244. Referring to FIG. 2, the reference receiving device 120 may include an antenna 121 and a spectrum analyzer 122 (or, an electric field probe and an electric field strength meter). Also, the plurality of auxiliary receiving devices 211 to 244 are shown. Each of the auxiliary receiving devices 211 to 244 may have a configuration of a general power detection device. The auxiliary receiving devices 211 to 244 may be distributed at a plurality of points within the measurement target space 10, and may be manufactured in a small size in order to have little effects on a propagation environment within the measurement target space. Each of the reference receiving device 120 and the auxiliary receiving devices 211 to 244 may be connected to the control device 130 and operate under the control of the control device 130. Meanwhile, although not shown in FIG. 2, when the transmitter 110 for transmitting the above-described intentional transmission signal is used, the transmitter 110 may also be connected to the control device 130.

The recent measurement instruments including spectrum analyzers are being miniaturized due to the development of technology, and models with battery-operated functions are also being released for outdoor environment measurement. However, they have more than a certain size for user interfacing because they need to have displays showing measurement results and buttons for various settings required for measurement. On the other hand, since each of the auxiliary receiving devices is used to evaluate a reception power by identifying a relative difference from the measurement value of the reference receiving device 120 rather than measuring an absolute value, the auxiliary receiving devices may be configured relatively simply.

For example, each (e.g., 211) of the auxiliary receiving devices 211 to 244 shown in FIG. 2 includes an antenna 200, a low noise amplifier (LNA), a power detector, an analog-to-digital converter (ADC), a micro-controller, and a receiver 201 configured as an external interface. Such the configuration is the most basic configuration for evaluating a reception power, and in this case, the power detector is a key element determining the performance of the auxiliary receiving device. The dynamic range of the auxiliary receiving device may be determined by the dynamic range of the power detector constituting it. In case of a general power detector, it may have a dynamic range of about 40 dB. In contrast, the spectrum analyzer 122 of the reference receiving device 120 that measures a reference power may have a dynamic range of 160 dB or more.

In order to measure an electromagnetic wave attenuation according to a building by using a plane wave, the transmitter 110 may be separated from the measurement target space 10 by a predetermined distance and inject electromagnetic waves toward the measurement target space. The electromagnetic waves incident through an interface of the measurement target space 10 may reach into the measurement target space 10 with a free space loss and a loss equal to the various shielding effects of the materials constituting the interface from the antenna of the transmitter 110. Considering these propagation path and interface loss, the auxiliary receiving device need not have a high upper limit of the dynamic range. However, since a large difference in the shielding effects of the materials constituting the interface in contact with the transmitter 110 may occur, and the electromagnetic waves introduced into the room may be reinforced or offset, it may be preferable for accurate measurement to use a receiver with a wide dynamic range in the auxiliary receiving device even not as much as the reference receiving device 120. The LNA positioned in front of the power detector serves to improve a reception sensitivity of the auxiliary receiving device, but does not broaden the dynamic range. Accordingly, as a structure for extending the dynamic range of the auxiliary receiving device, three reception paths composed of an attenuator, a bypass circuit, and the LNA may be configured between the antenna 200 and the power detector, and the dynamic range may be extended by selectively applying one of the three reception paths according to a range of the reception power. For example, in case of using a 20 dB attenuator and an LNA with a gain of 20 dB, if the power detector has a dynamic range of 40 dB and three paths are selectively operated, the auxiliary receiving device may secure a dynamic range of 80 dB. The above-described circuit configuration for extending the dynamic range may be implemented using a packaged chip.

The reference receiving device 120 may be configured using the antenna 121 and the spectrum analyzer 122 (or, probe and electric field strength meter), and may measure the power as an absolute physical quantity at a measurement point. In this case, the antenna may be an isotropic antenna, but a directional antenna may be used to secure a dynamic range of the measurement system. The reference receiving device 120 may be preferably located in the center of the measurement target space 10, and the auxiliary receiving devices 211 to 244 may be located at points distributed at regular intervals in the measurement target space.

Before performing the measurement using the auxiliary receiving devices 211 to 244, a propagation environment of the measurement target space 10 may be measured using the reference receiving device 120. By measuring a power for each frequency received in the measurement target space 10 in a state in which the transmitter 110 located outside the measurement target space is not operated, a minimum transmission power for measuring an electromagnetic wave loss of the building may be set. In order to perform the measurement with a minimum damage occurring due to the measurement of the electromagnetic wave attenuation, signals injected from the transmitter 110 located outside the measurement target space 10 into the measurement target space 10 may be configured to be higher than a noise figure, or a band with a high noise figure may be avoided and an adjacent frequency may be used for the measurement.

The reference receiving device 120 which is synchronized with the transmitter 110 located outside the measurement target space 10 and located within the measurement target space 10 may measure a reception power at a position where the reference receiving device 120 is located within the measurement target space 10 according to a frequency of the transmission signal incident from the transmitter 110 to the measurement target space 10. The reference receiving device 120 may transmit information on the measured reception power to the control device 130. In this case, the auxiliary receiving devices 211 to 244 may also transmit information on reception powers to the control device 130 through interfaces, respectively.

The control device 130 may check whether the reception power reported from each auxiliary receiving device is located within a dynamic range of each auxiliary receiving device. The function of determining whether the reception power is within the dynamic range may be performed based on information on each auxiliary receiving device that has already been input into the control device 130. Alternatively, a program built into the micro-controller inside each auxiliary receiving device may check whether the reception power is within the dynamic range of each auxiliary receiving device, and report a result of the checking to the control device 130.

In case of an auxiliary receiving device having capability to adjust its dynamic range, the micro-controller with control and determination functions may secure a dynamic range by selecting a reception path (e.g., attenuator, bypass circuit, or LNA) suitable for measurement of a reception power, and perform the measurement using the selected path. When the dynamic range is insufficient or the function for adjusting the dynamic range is not provided, the transmission power of the transmitter 110 may be adjusted through the control device 130, so that the reference receiving device 120 and the auxiliary receiving devices 211 to 244 can measure the reception powers within measurement target space 10.

As an interface between each of the auxiliary receiving devices 211 to 244 and the control device 130, a wired interface such as a universal serial bus (USB), local area network (LAN), or fiber optic may be used, but a wireless interface such as WiFi or Bluetooth may be used. Also, a hub or a wireless router may be used for configuring a network therebetween. When such the wireless interface is used, the interface may be operated before performing the radio wave environment measurement, and may be used for configuration for the radio wave environment measurement. Alternatively, the measurement may be performed in a frequency band other than the frequency band used by the interfaces. However, since the wireless network for data transmission may be affected by the electromagnetic waves used for the evaluation of electromagnetic wave attenuation, when the frequency is changed after the measurement, the signal transmission of the transmitter 110 may be stopped, and then information on the reception powers may be configured to be transferred to the control device 130 according to a request of the control device 130.

As described above, circuits constituting each of the auxiliary receiving devices 211 to 244 may be simply configured. For example, the circuit may be easily configured by combining one of various power detection modules having a wide band characteristic having a connection terminal to which only the antenna 200 is separately connected and a low-cost microcontroller module having a built-in ADC function and a wireless interface. Furthermore, by integrating the related chips on one board, it may be configured in a size smaller than a business card. In case of an operating frequency band, a high frequency band of 10 GHz or above has a large free space loss, and it is not known whether the equipment and communication networks operating in major facilities operate abnormally when exposed to such the high frequency bands. In this reason, it may not be suitable as a high-power electromagnetic wave attack target. Accordingly, the electromagnetic wave measurement system of the present disclosure may be applied to a frequency band of 10 GHz or below, but the operating frequency band may not limit the scope of the present disclosure.

It may be the antenna that determines the operating frequency band of the auxiliary receiving devices. In case of the LNA and power detector, they have a wide frequency operating range, but the operating range of the antenna may be relatively limited. A horn antenna having wideband characteristics or a log periodic dipole antenna (LPDA) may be used for the reference receiving device 120 of FIG. 2, but it has disadvantages in size and volume. In this reason, such the horn or LPDA antenna may not be suitable as an antenna of the plurality of auxiliary receiving devices. In case of a UWB antenna, it is small and has wideband characteristics of a bandwidth of several GHz, but has a lower gain than the antenna 121 used in the reference receiving device 120 due to its isotropic characteristics. The auxiliary receiving device has the advantage of being easy and inexpensive to configure, but has limited performance in terms of accuracy and performance, such as dynamic range, reception sensitivity, and different antenna gain for each frequency, compared to the reference receiving device 120. In order to evaluate the reception powers using such the auxiliary receiving devices, prior information on a relative error of each of the auxiliary receiving devices 211 to 244 with respect to the reference receiving device 120 may be required. The information on such the error may be stored in each of the auxiliary receiving devices 211 to 244 or the control device 130 through a pre-calibration process of the measurement system proposed in the present disclosure.

Hereinafter, a pre-calibration process of the measurement system proposed in the present disclosure will be described.

Figure 3:
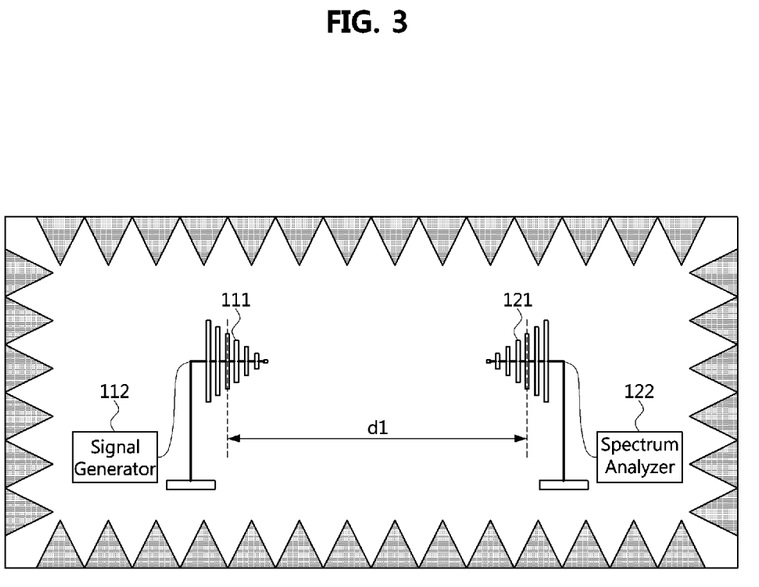
FIGS. 3 and 4 are conceptual diagrams for describing a calibration procedure between the transmitter and the reference receiving device according to an exemplary embodiment of the present disclosure.
Figure 4:
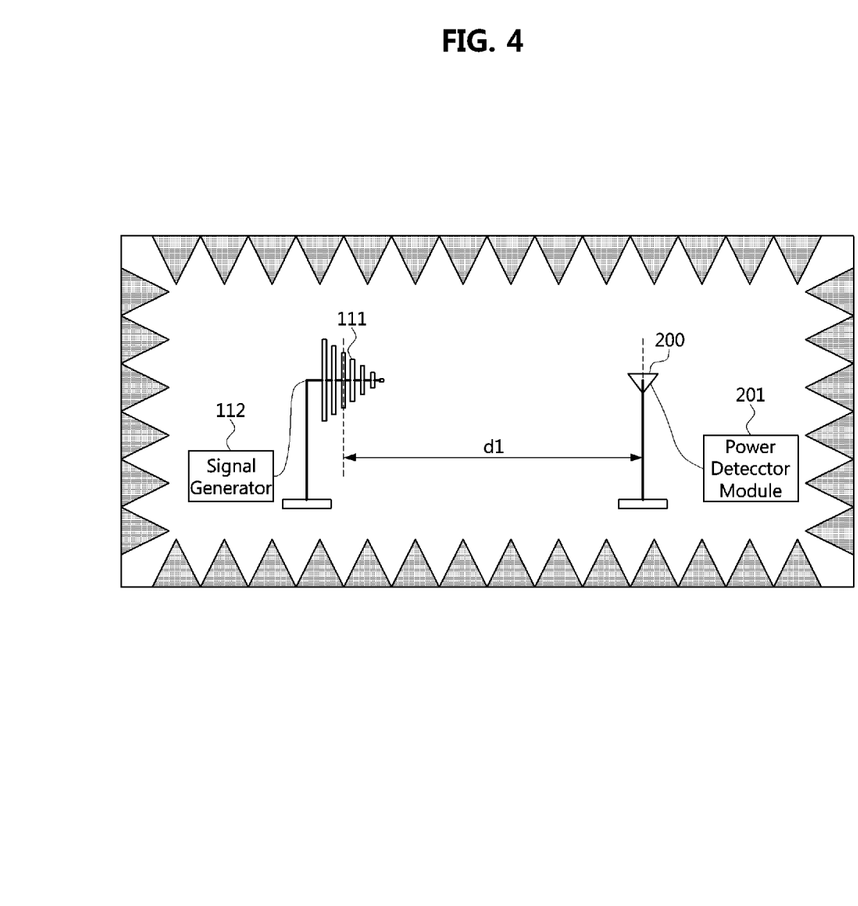

FIGS. 3 and 4 are conceptual diagrams for describing a calibration procedure between the transmitter and the reference receiving device according to an exemplary embodiment of the present disclosure.

FIG. 3 shows a basic configuration in which the reference receiving device 120 composed of the antenna 121 and the spectrum analyzer 122 measures a signal radiated from the transmitter 110 composed of a signal generator 112 and an antenna 111. The reference receiving device 120 may include the reception antenna 121 and the spectrum analyzer 122. In the transmitter 110 composed of the signal generator and the transmission antenna, although not shown in FIG. 3, a coupler and a power meter (or a spectrum analyzer corresponding thereto) for identifying a power input to the transmission antenna 111 may be used. The transmitter 110 and the reference receiving device 120 may be connected to the control device 130 through a network as described above.

The control device 130 may measure and store a reference power for each frequency while changing the frequency at a point dl corresponding to a far field through the configuration shown in FIG. 3. In this case, a distance between the two antennas may be configured based on reference planes or points of the two antennas.

After the reference power is measured by the reference receiving device 120, each of the plurality of auxiliary receiving devices may be disposed as shown in FIG. 4, so that a reference plane of the antenna (e.g., 200) of each of the auxiliary receiving devices is disposed at the same position as the reference plane of the antenna 101 of the reference receiving device. The auxiliary receiving devices manufactured in small sizes may be battery-powered for ease of measurement. In a state where the reception antenna 200 of the auxiliary receiving device is disposed at the same position as the reception antenna 121 of the reference receiving device, the reception power for each frequency may be measured using a transmission signal of the same magnitude. In this case, a reception power of a signal received by the antenna 200 of the auxiliary receiving device may be measured using a signal processing circuit 201 of the auxiliary receiving device. The same measurement procedure may be performed for each of the auxiliary receiving devices 211 to 244, and a difference for each frequency between the reception power measured by each auxiliary receiving device and the reference power may be stored. As the antenna 121 used for measuring the reference power, a directional antenna may be used to secure a wide dynamic range of the measurement system. On the other hand, the antenna 200 of the auxiliary receiving device configured to be small may be configured as a single element, and thus an isotropic antenna may be used.

Based on frequency-specific calibration information for each auxiliary receiving device, which is obtained through the process of FIGS. 3 and 4, an absolute physical quantity may be obtained by calibrating the measurement values (i.e., reception powers) of the auxiliary receiving devices based on the measurement value (i.e., reception power) obtained from the reference receiving device 120 within the measurement target space 10 as shown in FIG. 1.

In general, a calibration process of the measurement system including a directional antenna as shown in FIGS. 3 and 4 may be performed in a (semi)anechoic room, and may be performed in an environment in which a reflection component is not input to the reception antenna. On the other hand, in a case of an indoor space within a general large-scale building, radio waves may be received not only in the direction of the transmission antenna but also in other directions due to complex scattering phenomena such as reflection, diffraction, refraction, and absorption by furniture, office equipment, and business equipment placed within the space. For this reason, if a directional antenna is used to measure the reference power in an indoor environment in a general large-scale building, the calibration information may be updated by comparing a power obtained by rotating the directional antenna at a position with a reception power of the auxiliary receiving device measured at the same position. A process of applying a difference between the calibration value measured in the same environment and in the same position and the calibration value measured in a (semi)anechoic room without reflections to all auxiliary receiving devices may be performed. Even if an isotropic antenna is used when measuring the reference power, the above-described process may be necessary.

Meanwhile, a field probe may be used to more accurately measure the distribution of the electric field. When using an antenna, it is generally possible to measure only a single-axis component, but when using a field probe, it is possible to measure an electric field of three-axis components.

Figure 5:
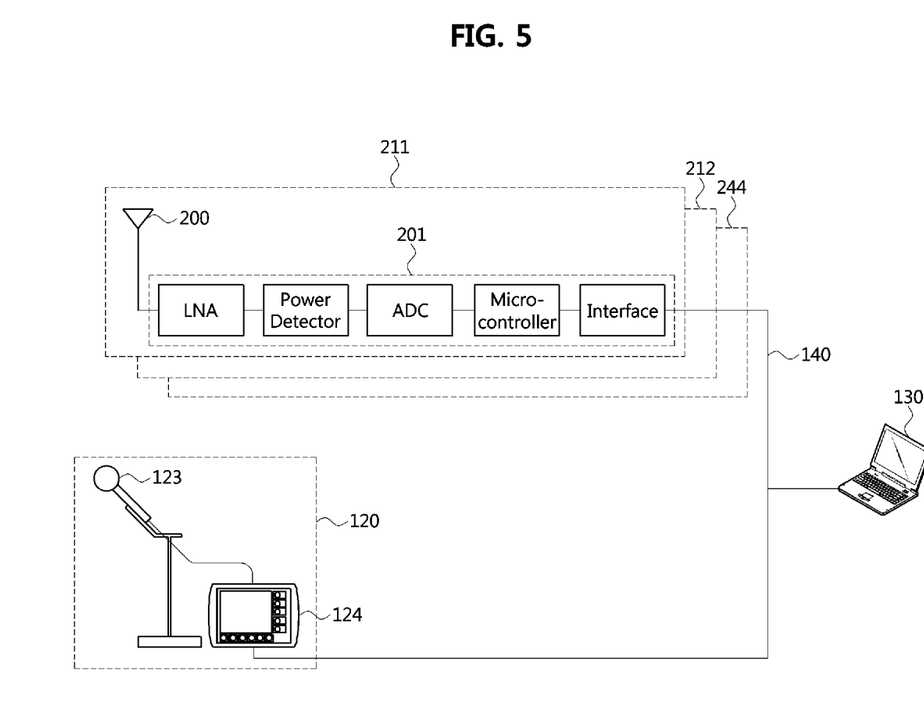
FIG. 5 is a conceptual diagram for describing another arrangement of an electromagnetic wave measurement system according to an exemplary embodiment of the present disclosure.

FIG. 5 is a conceptual diagram for describing another arrangement of an electromagnetic wave measurement system according to an exemplary embodiment of the present disclosure.

Comparing the case of FIG. 2 and the case of FIG. 5, a field probe 123 may be located in the center of the measurement target space 10 instead of the antenna 121. That is, the reference receiving device 120 may use the field probe 123 and an electric field strength meter 124 for measuring a strength of an electric field instead of the antenna 121 and the spectrum analyzer 122. Since the field probe 123 receives an electric field incident isotropically in all directions at the point where the probe 123 is located within the measurement target space 10, unlike when measuring using the directional antenna, the process of rotating the antenna may not be necessary. The measurement using the probe 123 may require a process of obtaining calibration information between the reference electric field measurement device and the auxiliary receiving devices in the same manner as the measurement using the antenna.

Figure 6:
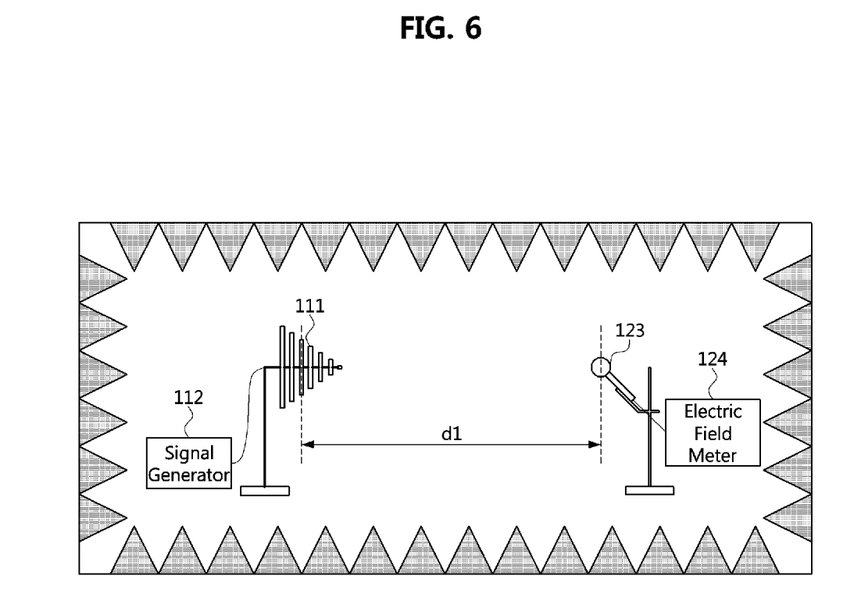
FIG. 6 is a conceptual diagram for describing another example of a calibration procedure between the transmitter and the reference receiving device according to an exemplary embodiment of the present disclosure.

FIG. 6 is a conceptual diagram for describing another example of a calibration procedure between the transmitter and the reference receiving device according to an exemplary embodiment of the present disclosure.

FIG. 6 shows a measurement configuration of the electric field strength meter to obtain frequency-specific calibration information. After configuring the center of the field probe 123 to be located at a separation distance dl as in the process of obtaining frequency-specific calibration information of the auxiliary receiving device by using the antenna, which was described with reference to FIGS. 3 and 4, the received electric field strength for each frequency may be measured and stored based on the same transmission power.

As described in the process of obtaining the calibration information of the antenna, since the (semi)anechoic room is an environment without reflected waves, only compensation for a reception performance in the direction of the transmission antenna may be possible for both the field probe 123 and the reception antenna 200 of the auxiliary receiving device. In order to overcome such the limitation, a radiation pattern may be obtained by rotating the reception antenna, and both the isotropic antenna or the field probe and the reception antenna 200 of the auxiliary receiving device may be measured under the same conditions and a difference therebetween may be used as the calibration information. Alternatively, calibration information of the isotropic reception performance of the isotropic antenna or the field probe 123 and the reception antenna 200 of the auxiliary reception device may be obtained using a reverberation room. When the same transmission power is used, reception powers of a standard isotropic antenna for power measurement located inside the reverberation room and the reception antenna of the auxiliary reception device may be respectively measured, and used as the calibration information. The field probe 123 may also be calibrated by using a difference between the reception power of the reception antenna of the auxiliary receiving device and the electric field strength measured under the same conditions.

The performance of the receiver (e.g., 201 in FIG. 2) of the auxiliary receiving devices 211 to 244 may be measured by connecting the signal generator to the LNA before the calibration step of the auxiliary receiving devices. The antenna 200 and the receiver 201 constituting the auxiliary receiving devices may be configured to be connected through an RF connector. In this case, it is possible to secure versatility by changing a frequency band to be measured or by easily upgrading only necessary components when improving the performance.

After securing information on a reception sensitivity, a dynamic range, and a reception power measurement range through an antenna that each of the auxiliary receiving devices has, the measurement system may be configured in a measurement target space within a general large-scale building as shown in FIG. 1. Since measurable levels of the auxiliary receiving devices are already known, when measurement ranges of the auxiliary receiving devices are exceeded, the distribution characteristics of the reception powers within the measurement target space may be measured by adjusting the transmission power of the transmitter 110 through the control device connected to the transmitter.

Figure 7:
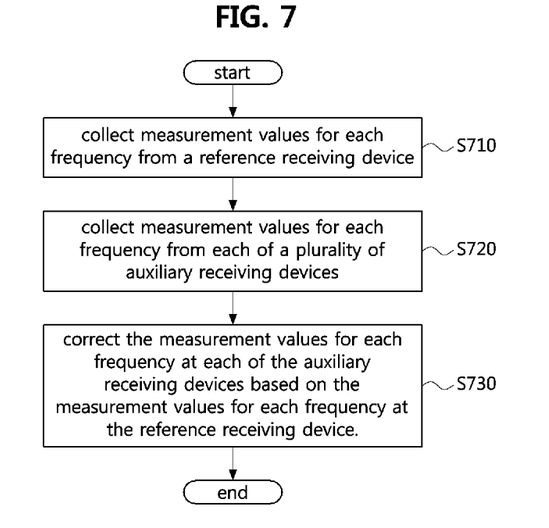
FIG. 7 is a flowchart illustrating an electromagnetic wave measurement method of an electromagnetic wave measurement system according to an exemplary embodiment of the present disclosure.

FIG. 7 is a flowchart illustrating an electromagnetic wave measurement method of an electromagnetic wave measurement system according to an exemplary embodiment of the present disclosure.

The electromagnetic wave measurement method shown in FIG. 7 corresponds to a method performed by a control device connected to a reference receiving device and a plurality of auxiliary receiving devices. That is, FIG. 7 is a flowchart for describing the operation of the electromagnetic wave measurement system (i.e., system of FIG. 2 or FIG. 5) composed of the reference receiving device and the plurality of auxiliary receiving devices.

Referring to FIG. 7, the electromagnetic wave measurement method according to an exemplary embodiment of the present disclosure may comprise: a step S710 of collecting a frequency-specific measurement value from the reference receiving device, a step S720 of collecting a frequency-specific measurement value from each of the plurality of auxiliary receiving devices; and a step S730 of calibrating the frequency-specific measurement value of each of the auxiliary receiving devices based on the frequency-specific measurement value of the reference receiving device. However, the respective steps of FIG. 7 are merely an exemplary embodiment, and the order of the steps of collecting measurement values and calibrating the measurement values using the reference power is not limited to the exemplary embodiment of FIG. 7.

In this case, the reference receiving device may have a wider dynamic range than the plurality of auxiliary receiving devices. In addition, each of the reference receiving device and the auxiliary receiving device may be configured with a field probe and an electric field strength meter for measuring a magnitude of an electric field, or may be configured with an antenna and a spectrum analyzer for measuring a reception power.

On the other hand, the electromagnetic wave measurement method may further comprise a step of generating, for each of the plurality of auxiliary receiving devices, frequency-specific calibration information for calibrating the frequency-specific measurement value of each of the plurality of auxiliary receiving devices based on the frequency-specific measurement value of the reference receiving device, while moving each of the plurality of auxiliary receiving devices to a position same as a position of the reference receiving device.

In this case, if each of the reference receiving device and the auxiliary receiving devices is configured with an isotropic antenna or a field probe, the frequency-specific calibration information may be generated in a state in which the reference receiving device and the auxiliary receiving devices are located in a reverberation room, and if each of the reference receiving device and the auxiliary receiving devices is configured with a directional antenna, the frequency-specific calibration information may be generated in a state in which the reference receiving device and the auxiliary receiving devices are located in a (semi)anechoic room.

Meanwhile, the electromagnetic wave measurement method may further comprise a step of outputting electromagnetic wave attenuation characteristics of the measurement target space as a ratio between a reception power of an unintentional transmission signal which is measured outside the measurement target space and a reception power of the unintentional transmission signal which is measured inside the measurement target space. Also, the unintentional transmission signal may be transmitted from a transmitter for broadcasting or communication located around the measurement target space.

Meanwhile, the measurement system may further include a transmitter that incidents an intentional transmission signal into the measurement target space from outside the measurement target space, and the electromagnetic wave measurement method may further comprise a step of outputting electromagnetic wave attenuation characteristics of the measurement target space as a ratio between a reception power of the intentional transmission signal which is measured outside the measurement target space and a reception power of the intentional transmission signal which is measured inside the measurement target space.

Meanwhile, the electromagnetic wave measurement method may further comprise a step of adjusting the transmission power of the transmitter such that reception powers of the transmission signal at the auxiliary receiving devices are located within a dynamic range of the auxiliary receiving devices.

Figure 8:
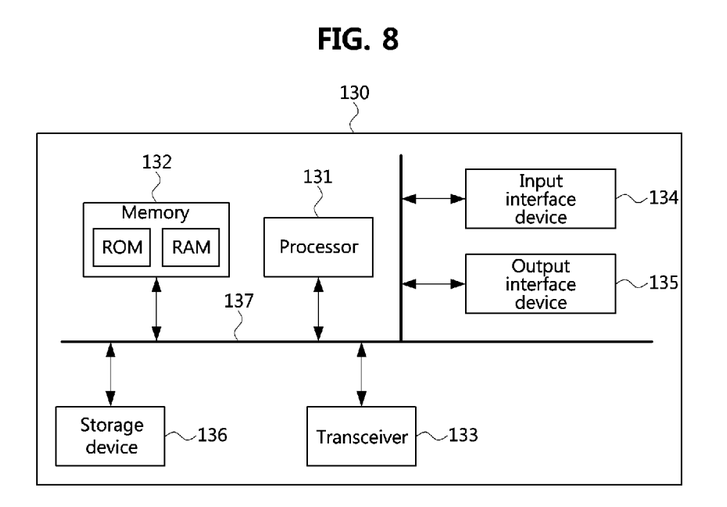
FIG. 8 is a block diagram illustrating a control device constituting an electromagnetic wave measurement system according to an exemplary embodiment of the present disclosure.

FIG. 8 is a block diagram illustrating a control device constituting an electromagnetic wave measurement system according to an exemplary embodiment of the present disclosure.

Referring to FIG. 8, a control device 130 may comprise at least one processor 131, a memory 132, and a transceiver 133 connected to the network for performing communications. Also, the control device 130 may further comprise an input interface device 134, an output interface device 135, a storage device 136 and the like. The respective components included in the control device 130 may communicate with each other as connected through a bus 137. However, each component included in the control device 130 may be connected to the processor 131 via an individual interface or a separate bus, rather than the common bus 137. For example, the processor 131 may be connected to at least one of the memory 132, the transceiver 133, the input interface device 134, the output interface device 135, and the storage device 136 via a dedicated interface.

The processor 131 may execute a program stored in at least one of the memory 132 and the storage device 136. The processor 131 may refer to a central processing unit (CPU), a graphics processing unit (GPU), or a dedicated processor on which methods in accordance with embodiments of the present disclosure are performed. Each of the memory 132 and the storage device 136 may be constituted by at least one of a volatile storage medium and a non-volatile storage medium. For example, the memory 132 may comprise at least one of read-only memory (ROM) and random access memory (RAM).

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. An electromagnetic wave measurement system for measuring a distribution of electromagnetic waves within a measurement target space, the electromagnetic wave measurement system comprising:
a reference receiving device;
a plurality of auxiliary receiving devices; and
a control device connected to the reference receiving device and the plurality of auxiliary receiving devices,
wherein the reference receiving device has a wider dynamic range of electric field strength or reception power measurements than the plurality of auxiliary receiving devices, the control device collects a frequency-specific measurement value from each of the reference receiving device and the plurality of auxiliary receiving devices, and the frequency-specific measurement value of each of the auxiliary receiving devices is calibrated based on the frequency-specific measurement value of the reference receiving device.

2. The electromagnetic wave measurement system according to claim 1, wherein each of the reference receiving device and the auxiliary receiving devices is configured with a field probe and an electric field strength meter for measuring a magnitude of an electric field.

3. The electromagnetic wave measurement system according to claim 1, wherein each of the reference receiving device and the auxiliary receiving devices is configured with an antenna and a spectrum analyzer for measuring a reception power.

4. The electromagnetic wave measurement system according to claim 1, wherein the control device generates, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

5. The electromagnetic wave measurement system according to claim 4, wherein when each of the reference receiving device and the auxiliary receiving devices is configured with an isotropic antenna or a field probe, the frequency-specific calibration information is generated in a state in which the reference receiving device and the auxiliary receiving devices are located in a reverberation room, and when each of the reference receiving device and the auxiliary receiving devices is configured with a directional antenna, the frequency-specific calibration information is generated in a state in which the reference receiving device and the auxiliary receiving devices are located in a (semi) anechoic room.

6. The electromagnetic wave measurement system according to claim 5, wherein when the frequency-specific calibration information is generated in a state in which the reference receiving device and the auxiliary receiving devices are located in the (semi)anechoic room, the frequency-specific calibration information is generated by rotating the field probe or antenna of each of the reference receiving device and the auxiliary receiving devices.

7. The electromagnetic wave measurement system according to claim 1, wherein the control device outputs electromagnetic wave attenuation characteristics of the measurement target space as a ratio between a reception power of an unintentional transmission signal which is measured outside the measurement target space and a reception power of the unintentional transmission signal which is measured inside the measurement target space, the unintentional transmission signal being transmitted from a transmitter for broadcasting or communication located around the measurement target space.

8. The electromagnetic wave measurement system according to claim 1, wherein the measurement system further includes a transmitter that incidents an intentional transmission signal into the measurement target space from outside the measurement target space, and the control device outputs electromagnetic wave attenuation characteristics of the measurement target space as a ratio between a reception power of the intentional transmission signal which is measured outside the measurement target space and a reception power of the intentional transmission signal which is measured inside the measurement target space.

9. The electromagnetic wave measurement system according to claim 8, wherein the control device adjusts the transmission power of the transmitter such that reception powers of the transmission signal at the auxiliary receiving devices are located within a dynamic range of electric field strength or reception power measurements of the auxiliary receiving devices.

10. An electromagnetic wave measurement method for measuring a distribution of electromagnetic waves within a measurement target space, performed by a control device in a measurement system including a reference receiving device, a plurality of auxiliary receiving devices, and the control device, the electromagnetic wave measurement method comprising:
 collecting a frequency-specific measurement value from the reference receiving device;
 collecting a frequency-specific measurement value from each of the plurality of auxiliary receiving devices; and
 calibrating the frequency-specific measurement value of each of the auxiliary receiving devices based on the frequency-specific measurement value of the reference receiving device,
 wherein the reference receiving device has a wider dynamic range of electric field strength or reception power measurements than the plurality of auxiliary receiving devices.

11. The electromagnetic wave measurement method according to claim 10, further comprising generating, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

12. The electromagnetic wave measurement method according to claim 11, wherein when each of the reference receiving device and the auxiliary receiving devices is configured with an isotropic antenna or a field probe, the frequency-specific calibration information is generated in a state in which the reference receiving device and the auxiliary receiving devices are located in a reverberation room, and when each of the reference receiving device and the auxiliary receiving devices is configured with a directional antenna, the frequency-specific calibration information is generated in a state in which the reference receiving device and the auxiliary receiving devices are located in a (semi) anechoic room.

13. The electromagnetic wave measurement method according to claim 12, wherein when the frequency-specific calibration information is generated in a state in which the reference receiving device and the auxiliary receiving devices are located in the (semi)anechoic room, the frequency-specific calibration information is generated by rotating the field probe or antenna of each of the reference receiving device and the auxiliary receiving devices.

14. The electromagnetic wave measurement method according to claim 10, further comprising outputting electromagnetic wave attenuation characteristics of the measurement target space as a ratio between a reception power of an unintentional transmission signal which is measured outside the measurement target space and a reception power of the unintentional transmission signal which is measured inside the measurement target space, the unintentional transmission signal being transmitted from a transmitter for broadcasting or communication located around the measurement target space.

15. The electromagnetic wave measurement method according to claim 10, further comprising, when the measurement system further includes a transmitter that incidents an intentional transmission signal into the measurement target space from outside the measurement target space, outputting electromagnetic wave attenuation characteristics of the measurement target space as a ratio between a reception power of the intentional transmission signal which is measured outside the measurement target space and a reception power of the intentional transmission signal which is measured inside the measurement target space.

16. The electromagnetic wave measurement method according to claim 15, further comprising adjusting the transmission power of the transmitter such that reception powers of the transmission signal at the auxiliary receiving devices are located within a dynamic range of electric field strength or reception power measurements of the auxiliary receiving devices.

17. A control device of a measurement system including a reference receiving device, a plurality of auxiliary receiving devices, and the control device, the control device comprising:
 a processor;
 a memory electronically communicating with the processor; and
 instructions stored in the memory,
 wherein when executed by the processor, the instructions cause the control device to:
 collect a frequency-specific measurement value from the reference receiving device;
 collect a frequency-specific measurement value from each of the plurality of auxiliary receiving devices; and
 calibrate the frequency-specific measurement value of each of the auxiliary receiving devices based on the frequency-specific measurement value of the reference receiving device,
 wherein the reference receiving device has a wider dynamic range of electric field strength or reception power measurements than the plurality of auxiliary receiving devices.

18. The control device according to claim 17, wherein the instructions further cause the control device to: generate, for each of the plurality of auxiliary receiving devices, frequency-specific calibration information for calibrating the frequency-specific measurement value of each of the plurality of auxiliary receiving devices based on the frequency-specific measurement value of the reference receiving device, by moving each of the plurality of auxiliary receiving devices to a position same as a position of the reference receiving device.

19. The control device according to claim 18, wherein when each of the reference receiving device and the auxiliary receiving devices is configured with an isotropic antenna or a field probe, the frequency-specific calibration information is generated in a state in which the reference receiving device and the auxiliary receiving devices are located in a reverberation room, and when each of the reference receiving device and the auxiliary receiving devices is configured with a directional antenna, the frequency-specific calibration information is generated in a state in which the reference receiving device and the auxiliary receiving devices are located in a (semi)anechoic room.

20. The control device according to claim 19, wherein when the frequency-specific calibration information is generated in a state in which the reference receiving device and the auxiliary receiving devices are located in the (semi)anechoic room, the frequency-specific calibration information is generated by rotating the field probe or antenna of each of the reference receiving device and the auxiliary receiving devices.

\* \* \* \* \*